(12) United States Patent
Neuwardt et al.

(10) Patent No.: US 6,403,878 B1
(45) Date of Patent: Jun. 11, 2002

(54) EMC SHIELDING DEVICE FOR A HOUSING

(75) Inventors: Klaus Neuwardt, Simbach b. Landau; Alexander Prinz, Postmuenster; Siegfried Schneiderbauer, Rossbach; Werner Spateneder, Pfarrkirchen, all of (DE)

(73) Assignee: Knuerr-Mechnik fuer die Elektronik Aktiengesellschaft, Munich (DE)

( * ) Notice: Subject to any disclaimer, the term of this patent is extended or adjusted under 35 U.S.C. 154(b) by 0 days.

(21) Appl. No.: 09/567,424

(22) Filed: May 10, 2000

(30) Foreign Application Priority Data

May 10, 1999 (DE) ..................................... 299 08 347 U

(51) Int. Cl.⁷ ................................................ H05K 9/00
(52) U.S. Cl. ................................ 174/35 GC; 174/35 R; 361/816
(58) Field of Search ........................... 174/35 R, 35 GC; 361/816, 818, 800, 752

(56) References Cited

U.S. PATENT DOCUMENTS 5,162,610 A 11/1992 Clifton et al. ............. 174/35 R
5,438,482 A * 8/1995 Nakamura et al. .......... 361/816

* cited by examiner

Primary Examiner—Dean A. Reichard
Assistant Examiner—Hung V Ngo
(74) Attorney, Agent, or Firm—Crowell & Moring LLP

(57) ABSTRACT

A particularly advantageous EMC shielding of a housing with side parts, transverse sections, a cover plate and a base plate is obtained by labyrinth-like areas of the side parts and lateral marginal legs of the cover plate as well as by a cover plate and/or a base plate including a double-walled edge area with a marginal leg, which engages in a groove of the transverse section.

19 Claims, 1 Drawing Sheet

EMC SHIELDING DEVICE FOR A HOUSING

BACKGROUND AND SUMMARY OF THE INVENTION

This application claims the priority of German Application No. 29908347.0, filed May 10, 1999, the disclosure of which is expressly incorporated by reference herein.

1. Field of the Invention

The invention relates to electromagnetic (EMC) shielding of walls or parts of a casing or housing, particularly a table casing or housing, which has side parts, transverse sections, a cover plate and a base plate, in which at least the cover plate is provided with lateral marginal legs in the vicinity of the side parts and marginal legs in the vicinity of the transverse sections.

2. Discussion of the Background

German Patent document DE 295 02 404UI discloses an EMC-shielded means with two front and two rear transverse sections between two side parts. A cover plate and a base plate are fixed to the side parts with the aid of plug connections. Finger-like engagement elements are provided as plug connections particularly on the side parts. These elements cooperate with receptacles constructed in a complementary manner, e.g. approximately trapezoidal bulges, particularly in angular marginal legs of the cover plate and the base plate. Contact studs are constructed in the area of the plug connections as EMC shields and when the finger-like engagement elements are inserted in the receptacles, material abrasion and contacting occurs.

In conventional devices the front and rear transverse sections are integrated into the base and cover plates. There is an EMC shielding at the front by EMC spring contact strips, which are positioned on angular legs of the front panels.

It is known to provide such subassembly carriers with an external housing or casing for use as a table housing.

SUMMARY OF THE INVENTION

The object of the invention is to create a structure for EMC shielding of a housing, particularly the side parts and transverse sections with respect to a cover plate and/or base plate, which ensures an extremely simple construction, a rational manufacture and a particularly efficient EMC shielding.

According to the invention this object is achieved by a housing, which has side parts and transverse sections, as well as a cover plate and a base plate. At least the cover plate is provided with lateral marginal legs in the vicinity of the side parts and marginal legs in the in the vicinity of the transverse sections, wherein the side parts, at least on their upper edges, are provided with labyrinth-like areas. The labyrinth-like edge area are formed by at least two supports for the cover plate and/or base plate. The lateral marginal legs of the cover plate and/or base plate extend over and beyond the labyrinth-like edge areas and are preferably oriented parallel to the side parts.

The fundamental ideal of the invention is an EMC shielding concept, which is based on labyrinth-like areas of the side parts, the cover plate and/or the base plate.

According to the invention, in their upper and/or lower edge areas and appropriately over their entire depth, the side parts are so bent or bevelled that a fitted cover plate and/or base plate rests or engages thereon with at least two supports.

According to an advantageous construction the bevels of the side parts are constructed as a labyrinth bow. High shielding efficiency values occur with a labyrinth-like edge area, which in cross-section is constructed roughly as a horizontal Z or as a U or V-shaped groove.

According to the invention, the lateral marginal legs of the cover plate and/or base plate in each case extend over the labyrinth-like edge areas, so that the latter are covered. The lateral marginal legs are generally 90° bends and are parallel to the side parts.

It is particularly advantageous for the length of the lateral marginal legs of the cover plate and/or base plate to be such that at very high frequencies they have approximately a $\lambda/4$ character. Electromagnetic waves entering the U or V-groove are attenuated to a surprisingly high degree, particularly by reflection and absorption.

The labyrinth-like edge areas and at least the supports together with the corresponding bearing areas of the cover plate and/or base plate, are kept free from paint finishes, so that a metallic contact face is present. When constructing a U or V-shaped groove with an inside connecting leg and an outside free leg, it is advantageous for an outside support to be located on the free leg in a corner area of a fitted cover plate.

A further intermediate space with the side parts is formed by the lateral marginal legs of a cover plate or base plate running parallel to the side parts in the case of a corresponding marginal leg length. It is also possible to lengthen the lateral marginal legs with additional wall elements. Electromagnetic waves entering the intermediate space between the lateral marginal legs or extended lateral marginal legs are also attenuated by reflection and absorption.

It is particularly advantageous that the labyrinth-like edge areas are suitable for receiving an additional EMC seal. For example, an EMC sealing strand can be inserted or fitted in the U or V-shaped groove of the labyrinth-like edge areas, so that the transfer resistance between the cover or base plate and the side parts are further reduced and EMC shielding is improved.

According to a further development of the EMC shielding concept according to the invention, there is also a labyrinth-like construction in the region of the transverse sections, particularly the front transverse sections, with respect to the cover plate and/or base plate and also with this EMC-shielded means there can additionally be provided a seal for increasing the shielding action.

In the vicinity of the transverse sections, the cover plate and/or base plate has, in each case, a double-walled edge area, which is terminally provided with a marginal leg. This marginal leg is vertically oriented and engages in a groove of the transverse section, which is appropriately constructed in slot-like manner in an area directed towards the housing interior.

The double-walled edge area comprises a bearing leg, which is parallel to the actual cover or base plate, and, in the fitted state, rests on the transverse section of the housing. It is particularly advantageous if the bearing leg and transverse section are dimensioned in such a way that the transverse section is virtually covered. A front leg between the bearing leg and the actual cover or base plate is rearwardly inclined, so that the edge area has a roof-like construction. The double-walled edge area can, in cross-sections, also be locked upon as a slightly displaced, horizontal U.

The groove in the transverse section is constructed in complementary manner to the terminal marginal leg of the cover and/or base plate. The marginal leg also passes over the entire width of the transverse section or the housing and is so designed that it is almost completely embedded in the transverse section groove. As a result of the design as a labyrinth, high shielding efficiency values are obtained.

When an EMC seal is also provided, it is appropriate to provide the transverse section with a fastening web, which internally bounds the slot-like groove and serves to receive an EMC spring contact strip. Stud or point contacts on a spring section, which are directed into the groove when the EMC spring contact strip is sealed on, ensure an effective contacting of the marginal legs and also high shielding efficiency values.

Other objects, advantages and novel features of the present invention will become apparent from the following detailed description of the invention when considered in conjunction with the accompanying drawings.

BRIEF DESCRIPTION OF THE DRAWINGS

The invention is explained in greater detail hereinafter relative to the attached drawings, wherein.

DETAILED DESCRIPTION OF THE PREFERRED EMBODIMENT

Figure 1:
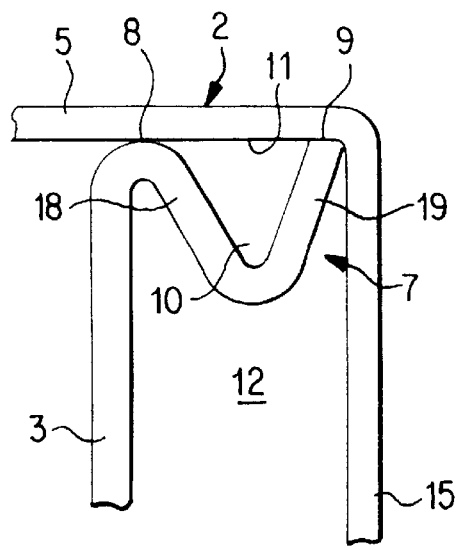
FIG. 1 is an EMC shielding structure according to the invention in the area of a side part and a cover plate of a housing.
Figure 2:
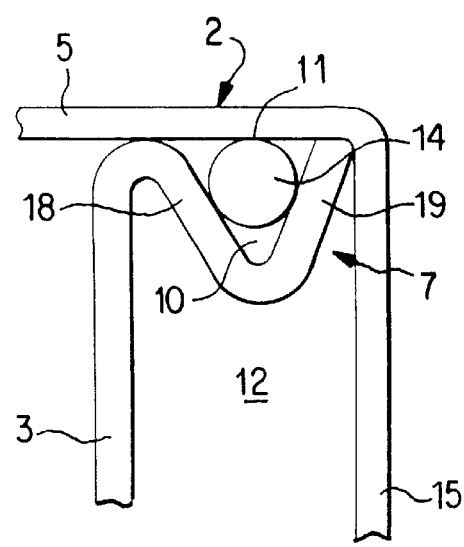
FIG. 2 shows the structure to FIG. 1, but with an additional EMC seal.

FIGS. 1 and 2 show a detail of a casing or housing 2 in the vicinity of a side part 3 and a cover plate 5. An identical arrangement can be provided on the base side between the side part 3 and a not shown base plate. In order to obtain a particularly high EMC shielding of the housing 2, the side parts 3 are provided with a labyrinth bow or labyrinth-like edge areas 7. In the present embodiment these labyrinth-like edge areas 7 are bends or bevels in the area of the upper edges extending over the entire depth or width of the side parts 3. As a result of the multiple bending two supports 8, 9 for the cover plate 5 are formed and bring about an advantageous punctiform or linear contact. The labyrinth-like edge area 7 is also constructed as a U or V-shaped groove 10, so that the labyrinth-like edge area 7 is virtually a horizontal Z.

A particularly high shielding effect is obtained when cover plate 5 has a lateral marginal leg 15, whose length is such that at least the labyrinth-like edge area 7 is covered. This covering means that the lateral marginal leg 15, which is parallel to the side part 3, extends at least up to an advantageously over and beyond the U or V-shaped groove 10.

Both the labyrinth-like edge area 7 and the cover plate 5 are provided in the vicinity of the supports 8, 9 and the entire labyrinth-like edge area 7 and consequently also the groove 10 is provided with a metallic surface. In a bearing area 11 extending from the inside support 8 at least up to the lateral angular marginal leg 15, the cover plate 5 is also metallized or not painted.

An important advantage of the EMC shield between the side parts 3 and a cover plate 5 or a base plate is that a very high attenuation is achieved without material abrasions. When the lateral marginal leg 15 has a length, which at very high frequencies has approximately a $\lambda/4$ character, as a result of a strong reflection and absorption in the labyrinth-like edge area 7, a considerable attenuation or elimination of electromagnetic waves is ensured both in the U-shaped groove 10 and in an intermediate space 12 between the side part 3 and the lateral marginal leg 15.

The advantageous EMC shielding by labyrinth-like edge constructions of the side parts 3 can be further improved by providing the V-shaped groove 10 with an EMC seal 14. If the EMC seal 14 contacts both an inside connecting leg 18 and an outside, free leg 19 of the V-shaped groove 10 as well as the cover plate 5, the structure has particularly good attenuation characteristics.

Figure 3:
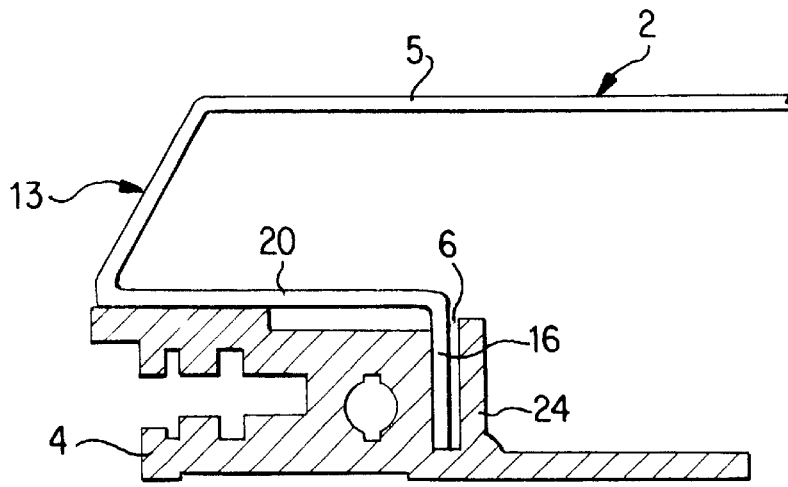
FIG. 3 shows and EMC-shielding structure with a cover plate an a transverse section of a housing.
Figure 4:
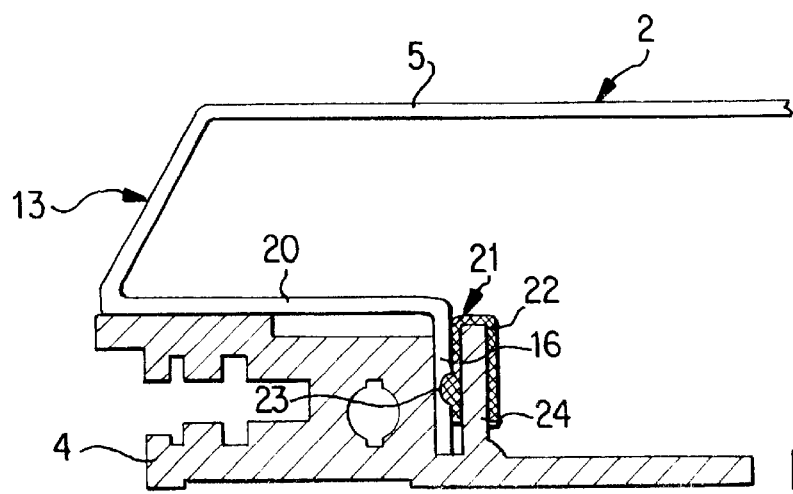
FIG. 4 shows the structure according to FIG. 3 with an additional EMC seal.

FIGS. 3 and 4 show a further labyrinth-like structure for EMC shielding in a front area of the housing 2. A cover plate 5 with a marginal leg 16 is fixed to a transverse section 4.

The cover plate 5 has a double-walled edge area 13, which has a virtually roof-like configuration or is in the form of a horizontal U. The terminally positioned, vertical marginal leg 16 engages in a groove 6 of the transverse section 4. The groove 6 is dimensioned in complementary manner to the marginal leg 16 and is constructed in slot-like form in an area of the transverse section 4 directed towards the housing interior.

A virtually horizontally positioned bearing leg 20 runs parallel to the cover plate 5 and is so dimensioned that the transverse section 4 is virtually covered. The bearing leg 20 and marginal leg 16 extend over the entire width or depth of the transverse section 4 of housing 2. The inside of the double-walled edge area 13 of the cover plate 5 is also not painted and consequently has a metallic surface in the same way as the transverse section 4 so that, at least in the groove 6, a metal contact is ensured. The labyrinth-like design of the double-walled edge areas 13 and the design of the slot-like groove 6 and marginal leg 16 ensure a high shielding effect.

FIG. 4 shows that shielding can be further improved by an EMC seal 21, which is constructed as a spring contact strip with a U-shaped spring section 22 and stud or point contacts 23. The stud and point contacts 23 contact the marginal leg 16 and the U-shaped spring section 22 is constructed in complementary manner to a fastening web 24 of the transverse section 4, so that it is easily possible to slide on or fit the EMC seal 21.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. An arrangement for electromagnetic EMC shielding of a housing, said arrangement comprising two side parts, at least one transverse section and a cover plate, wherein at least the cover plate is provided with lateral marginal legs in the vicinity of each of the two side parts and at least one transverse marginal leg each located in the vicinity of a respective one of the at least one transverse section,
    wherein each of the two side parts has a labyrinth-like edge area at least on an upper edge of each of said side parts,
    wherein each of said labyrinth-like edge area is formed by at least a first and second support for the cover plate, and wherein each lateral marginal legs of the cover plate extends over and beyond the respective labyrinth-like edge area.

2. The arrangement according to claim 1, wherein the labyrinth-like edge areas are formed by bent portions of the side parts.

3. The arrangement according to claim 1, wherein the labyrinth-like edge areas have at least one U or V-shaped groove.

4. The arrangement according to claim 3, wherein the first support is constructed as an inside support on a connecting leg and the second support is constructed as an outside support on a free leg of the labyrinth-like edge areas and extend over virtually the entire length of the side parts.

5. The arrangement according to claim 4, wherein each labyrinth-like edge area has a metallic surface at least in the area of the supports and wherein the cover plate has a metallic surface at least in bearing areas resting on the supports.

6. The arrangement according to claim 5, wherein the supports and the U or V-shaped groove of the labyrinth-like edge areas and the bearing areas of the cover plate, extending from the inside support to the lateral marginal legs, have metallic surfaces.

7. The arrangement according to claim 4, wherein the lateral marginal legs of at least the cover plate are constructed as a 90° bend, and wherein an intermediate space is formed between the lateral marginal legs and the side parts and the lateral marginal legs have such a length or are extendible in such a way that the electromagnetic waves entering the intermediate space and the U or V shaped groove are attenuated by reflection and absorption.

8. The arrangement according to claim 7, wherein the labyrinth-like edge areas have at least one EMC seal.

9. The arrangement according to claim 8, wherein the EMC seal is constructed as a sealing strand and is placed in the U or V-shaped groove.

10. The arrangement according to claim 7, wherein at least the cover plate has, in the vicinity of the transverse section, a double-walled edge area and the transverse section has a groove and the marginal leg, which is located on the double-walled edge area, engages in the groove of the transverse section.

11. The arrangement according to claim 10, wherein, in cross-section, the double-walled edge area is virtually constructed as a horizontal U and the marginal leg is positioned vertically.

12. The arrangement according to claim 11, wherein the double-walled edge area has a bearing leg, which is constructed parallel to the cover plate and rests on the transverse section.

13. The arrangement according to claim 12, wherein an EMC seal is located in the slot-like designed groove of the traverse section.

14. The arrangement according to claim 13, wherein an EMC spring contact strip is provided as the EMC seal.

15. The arrangement according to claim 14, wherein the EMC spring contact strip has a cross-sectionally U-shaped spring section for fixing to the transverse section and stud or point contacts for contacting the marginal leg.

16. The arrangement according to claim 15, wherein a fastening web is constructed on the transverse section and the EMC spring contact strip is detachably fixed by its U-shaped spring section to the fastening web.

17. An electromagnetic shielding arrangement for shielding a housing, said arrangement comprising:
a cover plate and two side parts wherein said cover plate includes two lateral marginal legs,
wherein the side parts each have an upper edge having a labyrinth-like edge portion;
at least a transverse section having a groove and a second marginal leg formed on the cover plate which engages in said groove;
wherein said labyrinth-like edge portion each are formed by a first support and a second support, and wherein each of the lateral marginal legs of the cover plate extends over and beyond the labyrinth-like edge portion, respectively.

18. The arrangement according to claim 17, wherein the labyrinth-like edge portion has a metallic surface at least in the area of the first and second supports and wherein the cover plate has a metallic surface at least in bearing areas resting on the first and second supports.

19. The arrangement according to claim 17, wherein the labyrinth-like edge portion has at least one U or V-shaped groove.

\* \* \* \* \*